(12) United States Patent
Nishida et al.

(10) Patent No.: US 10,194,525 B2
(45) Date of Patent: Jan. 29, 2019

(54) MULTILAYER WIRING BOARD, AND METHOD FOR MANUFACTURING MULTILAYER WIRING BOARD

(71) Applicant: HITACHI CHEMICAL COMPANY, LTD., Tokyo (JP)

(72) Inventors: Takanori Nishida, Ishioka (JP); Yuji Ushiyama, Ishioka (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/430,791

(22) PCT Filed: Sep. 26, 2013

(86) PCT No.: PCT/JP2013/076122
§ 371 (c)(1),
(2) Date: Mar. 24, 2015

(87) PCT Pub. No.: WO2014/050995
PCT Pub. Date: Apr. 3, 2014

(65) Prior Publication Data
US 2015/0282301 A1    Oct. 1, 2015

(30) Foreign Application Priority Data

Sep. 26, 2012  (JP) ................................. 2012-212328

(51) Int. Cl.
*H05K 1/02*    (2006.01)
*H05K 1/11*    (2006.01)
(Continued)

(52) U.S. Cl.
CPC .......... *H05K 1/0271* (2013.01); *H01L 23/12* (2013.01); *H05K 1/0298* (2013.01); *H05K 1/112* (2013.01);
(Continued)

(58) Field of Classification Search
CPC .... H05K 1/0271; H05K 1/115; H05K 1/0298; H05K 3/4652; H05K 3/4682;
(Continued)

(56) References Cited

U.S. PATENT DOCUMENTS 7,977,580 B2 * 7/2011 Ueno ...................... H01L 23/13
174/255
7,985,930 B2 * 7/2011 Asai ....................... H05K 3/387
174/255
(Continued)

FOREIGN PATENT DOCUMENTS

CN          101399210 A      4/2009
CN          101541145 A      9/2009
(Continued)

OTHER PUBLICATIONS

International Search Report for International Application No. PCT/JP2013/076122 dated Dec. 3, 2013.
English Translation of Written Opinion of the International Searching Authority for International Application No. PCT/JP2013/076122.

Primary Examiner — Ishwarbhai B Patel
(74) Attorney, Agent, or Firm — Fitch, Even, Tabin & Flannery

(57) ABSTRACT

A multilayer wiring board has a central wiring layer disposed in the center of an odd number of wiring layers, insulating layers and wiring layers disposed above and below the central wiring layer, respectively, an interlayer connections having cross-sectionally trapezoidal shapes and penetrating the insulating layers to establish interlayer connection between the wiring layers. The interlayer connection is disposed to connect to a portion below the central wiring layer. The interlayer connection is disposed to connect to a portion above the central wiring layer. The directions of tapers of the cross-sectionally trapezoidal shapes of the interlayer connections are identical.

10 Claims, 9 Drawing Sheets

(51) Int. Cl.
*H01L 23/12* (2006.01)
*H05K 3/46* (2006.01)
*H05K 1/14* (2006.01)

(52) U.S. Cl.
CPC ........... *H05K 1/115* (2013.01); *H05K 3/4652* (2013.01); *H05K 3/4682* (2013.01); *H01L 2924/0002* (2013.01); *H05K 1/14* (2013.01); *H05K 2201/0355* (2013.01); *H05K 2201/09827* (2013.01); *H05K 2203/1572* (2013.01)

(58) Field of Classification Search
CPC . H05K 2201/09827; H05K 2201/0355; H05K 2203/1572; H05K 1/0206; H05K 1/0221; H05K 1/0222; H05K 1/0225; H05K 1/0251; H05K 1/112; H05K 1/114; H05K 1/116; H05K 2201/09063; H05K 2201/09072; H05K 2201/0919; H05K 2201/092; H05K 2201/095; H05K 2201/09518; H05K 2201/09527; H05K 2201/09536; H05K 2201/09545; H05K 2201/09554; H05K 2201/09581; H05K 2201/096; H05K 2201/09609; H05K 2201/09618; H05K 2201/09627; H05K 2201/09636; H05K 2201/09809; H05K 2201/09818; H05K 2201/09836; H05K 2201/09845; H05K 2201/09854; H05K 2201/09863; H05K 3/4061; H05K 3/4069; H05K 3/4602; H01L 23/12; H01L 2924/0002; H01L 23/5226

See application file for complete search history.

(56) References Cited

U.S. PATENT DOCUMENTS

| | | | | |
|---|---|---|---|---|
| 8,394,225 | B2* | 3/2013 | Nakamura | H05K 3/4652 156/182 |
| 8,445,790 | B2* | 5/2013 | Lee | H05K 1/113 174/261 |
| 8,592,688 | B2* | 11/2013 | Inagaki | H01L 23/49816 174/255 |
| 8,609,997 | B2* | 12/2013 | Shomura | H05K 3/4602 174/260 |
| 2008/0211086 | A1* | 9/2008 | Morita | H01L 23/5389 257/702 |
| 2009/0139751 | A1* | 6/2009 | Sunohara | H01L 23/49833 174/255 |
| 2009/0242262 | A1* | 10/2009 | Asano | H05K 3/0064 174/267 |
| 2010/0096078 | A1 | 4/2010 | Nakamura | |
| 2013/0075147 | A1* | 3/2013 | Amano | H05K 3/4655 174/264 |

FOREIGN PATENT DOCUMENTS

| | | |
|---|---|---|
| JP | 2000-323613 A | 11/2000 |
| JP | 2004-235323 A | 8/2004 |
| JP | 4669908 B2 | 1/2011 |
| JP | 2011-129563 A | 6/2011 |
| JP | 2011-129681 A | 6/2011 |
| JP | 2011-199077 A | 10/2011 |
| TW | 201008402 A | 2/2010 |

\* cited by examiner

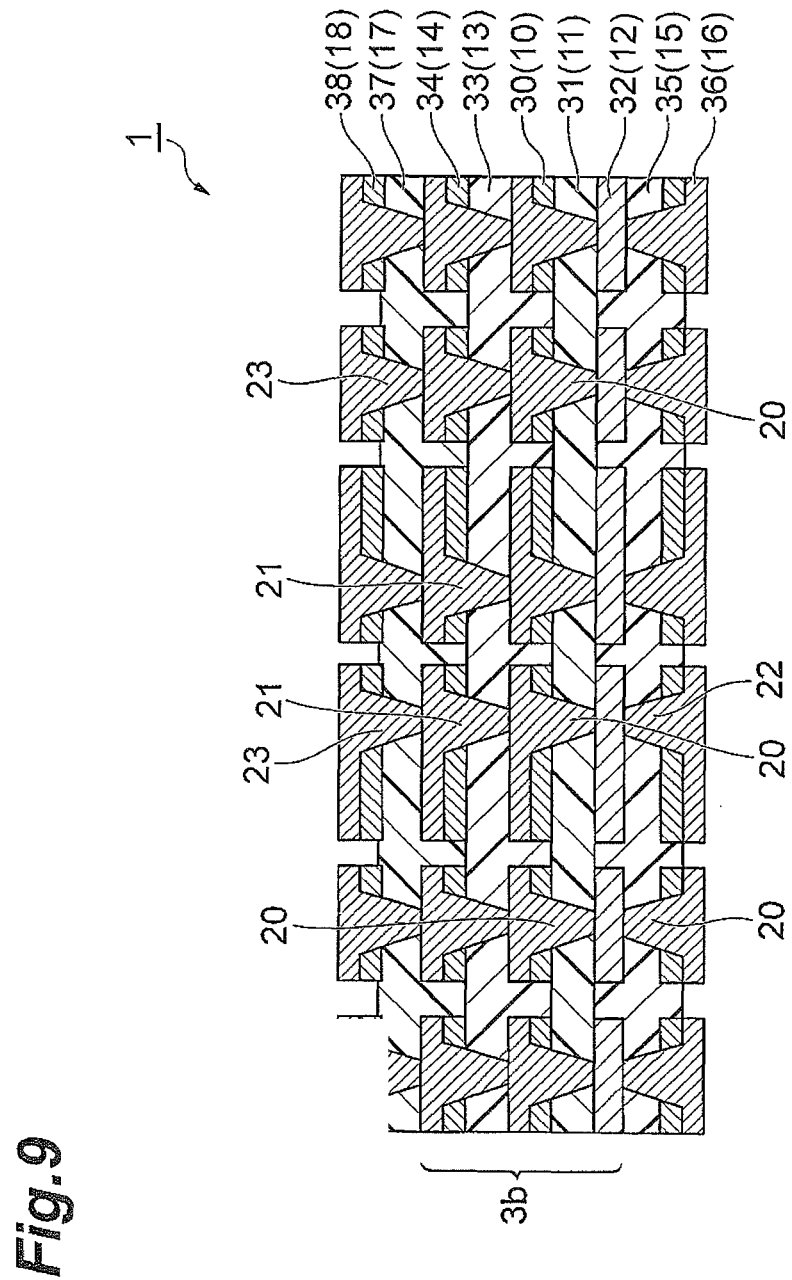

MULTILAYER WIRING BOARD, AND METHOD FOR MANUFACTURING MULTILAYER WIRING BOARD

TECHNICAL FIELD

The present invention relates to a multilayer wiring board, and a method for manufacturing the multilayer wiring board.

BACKGROUND ART

As a wiring board on which semiconductor devices that are electronic component elements are mounted, a multilayer wiring board has been widely used in which wiring layers are formed on both surfaces of a core board. In recent years, with a reduction in the thickness of the multilayer wiring board and an increase in the density of wiring patterns, an increasing number of multilayer wiring boards with no core board have been provided. Advantageously, a multilayer wiring board with no core board (hereinafter also referred to as a "core-less board") is easy to achieve thickness reduction and allows the wiring pattern to be densely formed.

As a method for manufacturing such a core-less board, a method for manufacturing a multilayer wiring board has been proposed which involves forming a laminate plate with desired numbers of insulating layers and wiring layers on each of the opposite surfaces of a support board that is a metal foil laminate plate, then separating the laminate plates from the support board, and executing subsequent steps on the separated laminate plates (see Patent Literatures 1 to 3). In this method, a multilayer wiring board is manufactured using a support board (hereinafter also referred to as a "dummy core") used only for a manufacturing process and not included in the multilayer wiring board itself corresponding to a product. The method is hereinafter referred to as a core-less method.

However, the multilayer wiring board with no core board is inferior to a multilayer wiring board with a core board in the strength of the board itself and is thus easy to warp. Consequently, for example, Patent Literature 4 proposes that, in a multilayer wiring board comprising a central wiring layer disposed in the thickness-wise center of a board and a wiring layer laminated, via an insulating layer, on one side and the other side of the board across the central wiring layer, vias on the one and other sides of the central wiring layer each have a narrow cross-sectionally trapezoidal shape on a side of the via toward the central wiring layer. This multilayer wiring board is formed to be symmetric with respect to the central wiring layer to allow the insulating layers, wiring layers, and vias on the one and other sides across the central wiring layer to balance stress. This suppresses warpage.

CITATION LIST

Patent Literature

[Patent Literature 1] Japanese Patent Application Laid-Open No. 2000-323613
[Patent Literature 2] Japanese Patent Application Laid-Open No. 2004-356219
[Patent Literature 3] Japanese Patent Application Laid-Open No. 2005-236067
[Patent Literature 4] Japanese Patent No. 4669908

SUMMARY OF INVENTION

Technical Problem

However, in the multilayer wiring board described in Patent Literature 4, the trapezoidal cross-sectional shapes of an upper and a lower interlayer connections connected directly to the central wiring layer need to be formed to be line symmetric with respect to the central wiring layer. In this case, a laminate plate with at most three wiring layers with no interlayer connection is produced on a dummy core. After the laminate plate is separated from the dummy core, interlayer connections and wiring layers are formed on each of the opposite sides of the laminate plate. Thus, when the multilayer wiring board described in Patent Literature 4 is to be produced using the core-less method, the laminate plate used is limited to a laminate plate comprising three wiring layers with no interlayer connection. As a result, the number of steps and a lead time needed to produce the multilayer wiring board may increase so as to reduce production efficiency. Furthermore, the laminate plate comprising three wiring layers with no interlayer connection may have low rigidity and be difficult to handle because of a small plate thickness and the lack of a plating layer. Additionally, such a laminate plate may be likely to be deformed or dimensionally changed and to be misaligned when boring is performed to form interlayer connections or when a pattern of wiring layers is formed.

The present invention has been developed in view of the above-described problem. An object of the present invention is to provide a multilayer wiring board which can be reduced in thickness of the board while being restrained from being warped and which achieves high connection reliability at low costs, and a method for manufacturing the multilayer wiring board.

Solution to Problem

The present invention relates, in one aspect, to a multilayer wiring board. The multilayer wiring board is a multilayer wiring board with an odd number of wiring layers laminated therein, comprising a central wiring layer disposed in a center of the odd number of wiring layers in a laminating direction, a first insulating layer and a first wiring layer which are disposed on a first side of the central wiring layer in the laminating direction, a second insulating layer and a second wiring layer which are disposed on a second side of the central wiring layer in the laminating direction, a first interlayer connection having a cross-sectionally trapezoidal shape and penetrating the first insulating layer to establish interlayer connection between the central wiring layer and the first wiring layer, and a second interlayer connection having a cross-sectionally trapezoidal shape and penetrating the second insulating layer to establish interlayer connection between the central wiring layer and the second wiring layer. The first interlayer connection is disposed so as to connect to the first side of the central wiring layer and the second interlayer connection is disposed so as to connect to the second side of the central wiring layer. Directions of tapers of the cross-sectionally trapezoidal shapes of the first and second interlayer connections are identical.

The above-described multilayer wiring board further comprises a third interlayer connection having a cross-sectionally trapezoidal shape and disposed on a front layer side on the first side of the central wiring layer and also on the first side with respect to the first interlayer connection, and the direction of the taper of the cross-sectionally trapezoidal shape of each of the first and second interlayer connections and a direction of taper of the cross-sectionally trapezoidal shape of the third interlayer connection may be opposite to each other. Furthermore, in this case, the multilayer wiring board may further comprise a third insulating layer and a third wiring layer which are disposed on the front layer side on the first side of the central wiring layer and also on the first side with respect to the first insulating layer and the first wiring layer, and the third interlayer connection may penetrate the third insulating layer to establish interlayer connection between the first wiring layer and the third wiring layer. The third interlayer connection may be disposed in the front layer on the first side.

The above-described multilayer wiring board may further comprise a fourth interlayer connection having a cross-sectionally trapezoidal shape and disposed on a front layer side on the second side of the central wiring layer and also on the second side with respect to the second interlayer connection, and the direction of the taper of the cross-sectionally trapezoidal shape of each of the first and second interlayer connections and a direction of taper of the cross-sectionally trapezoidal shape of the fourth interlayer connection may be identical. Furthermore, in this case, the multilayer wiring board may further comprise a fourth insulating layer and a fourth wiring layer which are disposed on a front layer side on the second side of the central wiring layer and also on the second side with respect to the second insulating layer and the second wiring layer, and the fourth interlayer connection may penetrate the fourth insulating layer to establish interlayer connection between the second wiring layer and the fourth wiring layer.

Furthermore, the present invention relates to, in another aspect, to a method for manufacturing a multilayer wiring board. The method is a method for manufacturing a multilayer wiring board with an odd number of wiring layers laminated therein, comprising (a) a step of laying, on top of a support metal foil of a support board with the support metal foil disposed on at least one surface of a support insulating layer, a first metal foil smaller than the support metal foil, a first insulating layer larger than the first metal foil, and a second metal foil, in this order, and performing a heating and pressuring operation, (b) a step of forming a first interlayer connection that penetrates the first insulating layer toward the support board to establish interlayer connection between the first metal foil and the second metal foil, (c) a step of laying a second insulating layer and a third metal foil on top of the second metal foil and performing a heating and pressuring operation, (d) a step of forming a second interlayer connection that penetrates the second insulating layer toward the support board to establish interlayer connection between the third metal foil and the second metal foil, and (e) a step of separating, from the support board, a laminate comprising the first, second, and third metal foil, the first and second insulating layers, and the first and second interlayer connections, between the first metal foil of the laminate and the support metal foil of the support board. Furthermore, the method for manufacturing the multilayer wiring board further comprises (f) a step of laying a third insulating layer and a fourth metal foil on top of the first metal foil formed on a first side of the laminate, the first side being a separated side from the support board, laying a fourth insulating layer and a fifth metal foil on top of the third metal foil formed on a second side of the laminate opposite to the separated side of the laminate, and performing a heating and pressuring operation, (g) a step of forming a third interlayer connection that penetrates the third insulating layer from a front layer on the first side toward the second side to establish interlayer connection between the first metal foil and the fourth metal foil, and (h) a step of forming a fourth interlayer connection that penetrates the fourth insulating layer from a front layer on the second side toward the first side to establish interlayer connection between the third metal foil and the fifth metal foil.

The above-described method for manufacturing the multilayer wiring board may further comprise (i) a step of processing the second metal foil to form a central wiring layer. Furthermore, the method for manufacturing the multilayer wiring board may further comprise (j) a step of processing the first metal foil and third metal foil of the laminate to form a first wiring layer and a second wiring layer on respective opposite surfaces of the laminate. Moreover, the method for manufacturing the multilayer wiring board may further comprise a step (k) of, after the step (d) and before the step (e), forming a laminate with an even number of insulating layers by repeating, a desired number of times, a step of laying an insulating layer and a metal foil on top of the third metal foil, performing a heating and pressuring operation, and forming an interlayer connection that penetrates the insulating layer toward the support board to establish interlayer connection between the metal foil on the support board side and the metal foil on a side away from the support board.

Advantageous Effects of Invention

According to the present invention, a multilayer wiring board can be provided which enables a reduction in the thickness of a board while suppressing warpage and which achieves high connection reliability at low costs. A method for manufacturing the multilayer wiring board can also be provided.

BRIEF DESCRIPTION OF DRAWINGS

FIG. 9 is a cross-sectional flow diagram illustrating a step of the method for manufacturing the multilayer wiring board depicted in FIG. 1.

DESCRIPTION OF EMBODIMENTS

An embodiment of a multilayer wiring board according to the present invention and an embodiment of a method for manufacturing the multilayer wiring board will be described below with reference to the drawings.

<Multilayer Wiring Board>

The embodiment of the multilayer wiring board according to the present invention will be described below using FIG. 1.

Figure 1:
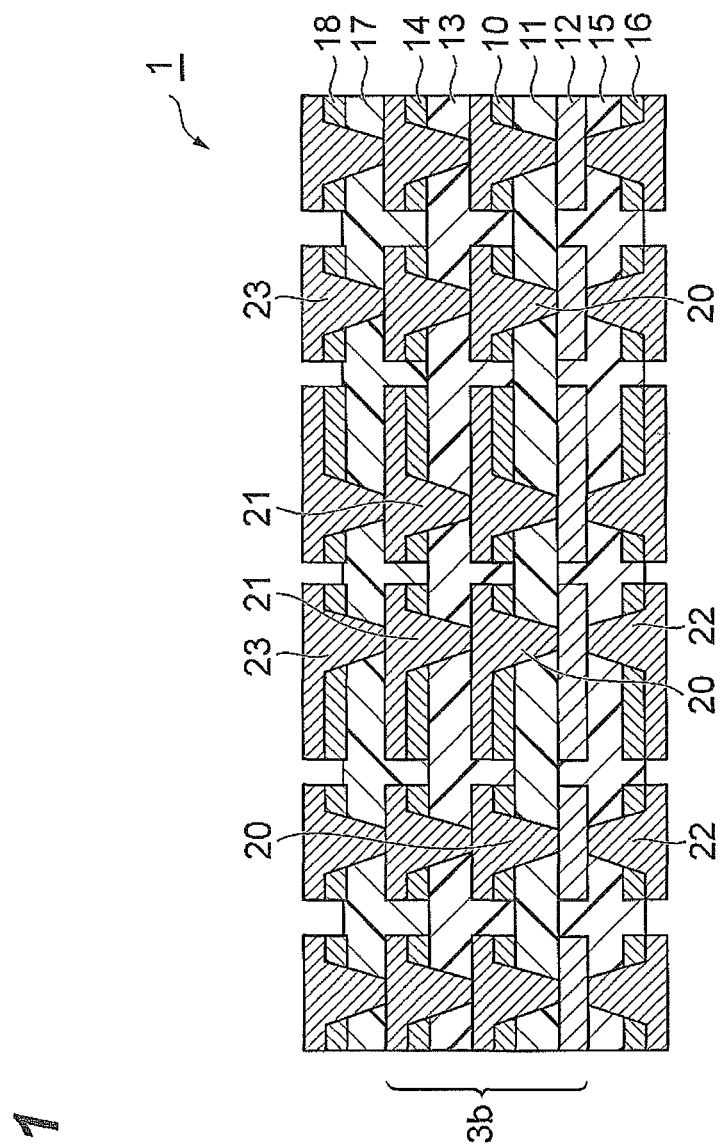
FIG. 1 is a diagram depicting a cross-sectional view of a multilayer wiring board according to the present embodiment.

As depicted in FIG. 1, a multilayer wiring board 1 according to the present embodiment is, for example, a multilayer wiring board on which electronic component elements are mounted, and comprises a central wiring layer 10, other wiring layers 12, 14, 16, 18, insulating layers 11, 13, 15, 17, and interlayer connections 20, 21, 22, 23. In the multilayer wiring board 1, above (on a second side of) the central wiring layer 10, the insulating layers 13, 17 and the wiring layers 14, 18 are laminated and arranged in the following order from the central wiring layer 10 toward upper front layers: the insulating layer 13, the wiring layer 14, the insulating layer 17, and the wiring layer 18. Below (on a first side of) the central wiring layer 10, the insulating layers 11, 15 and the wiring layers 12, 16 are laminated and arranged in the following order from the central wiring layer 10 toward lower front layers: the insulating layer 11, the wiring layer 12, the insulating layer 15, and the wiring layer 16. In such a laminate configuration, the central wiring layer 10 is disposed in the center of the wiring layers 16, 12, 10, 14, 18, the total laminate number of which is an odd number (five layers according to the present embodiment), in a laminating direction. The laminate number of the wiring layers in the multilayer wiring board 1 can be an odd number and is not limited to five layers but may be, for example, seven or eleven layers.

The central wiring layer is a wiring layer positioned in the center of the odd number of wiring layers in the laminating direction. For example, for a multilayer wiring board with five wiring layers, the third wiring layer from the upper or lower front layer (outermost layer) is the central wiring layer. Furthermore, the wiring layer means a piece of metal foil (in which no circuit pattern has been formed), a metal foil (in which no circuit pattern has been formed) containing plating formed on the metal foil at the time of interlayer connection, or either of the metal foils on which processing such as etching has been executed (in which a circuit pattern has been formed).

The interlayer connections 20 to 23 penetrate the insulating layers 11, 13, 15, 17 to establish interlayer connection among the wiring layers 10, 12, 14, 16, 18, respectively. Specifically, the interlayer connection 20 (first interlayer connection) penetrates the insulating layer 11 (first insulating layer) downward from above to establish interlayer connection between the central wiring layer 10 and the wiring layer 12 (first wiring layer). The interlayer connection 21 (second interlayer connection) penetrates the insulating layer 13 (second insulating layer) downward from above to establish interlayer connection between the wiring layer 14 (second wiring layer) and the central wiring layer 10. The interlayer connection 22 (third interlayer connection) penetrates the insulating layer 15 (third insulating layer) upward from below to establish interlayer connection between the wiring layer 16 (third wiring layer) and the wiring layer 12. The interlayer connection 23 (fourth interlayer connection) penetrates the insulating layer 17 (fourth insulating layer) downward from above to establish interlayer connection between the wiring layer 18 (fourth wiring layer) and the wiring layer 14. Formation of the interlayer connections 20 to 23 can be achieved by forming holes for interlayer connections in the insulating layers 11, 13, 15, 17 or the like downward from above or upward from below, for example, by means of laser processing or the like and then performing plating for the interlayer connections, respectively.

Each of the interlayer connections 20 to 23 is shaped like a truncated cone or a truncated quadrangular pyramid and is shaped like a trapezoid in cross section. The interlayer connections 20 to 23 each have a taper extending upward or downward when the multilayer wiring board 1 is placed horizontally. The taper refers to an inclination that gradually increases or decreases from a lower side toward an upper side or from the upper side toward the lower side of the cross-sectional shape. For example, for such an interlayer connection which has a cross-sectionally trapezoidal shape, when a hole for an interlayer connection is formed by laser processing such as a conformal method, a hole diameter on a laser incident side of the hole for an interlayer connection is generally large and decreases toward a bottom portion of the hole for an interlayer connection. The hole for an interlayer connection can be formed by utilizing this. The direction of the taper can be selected by setting an irradiation direction at the time of laser processing (for example, a downward direction from above or an upward direction from below.

As is apparent from FIG. 1, in the multilayer wiring board 1 according to the present embodiment, the interlayer connections 20, 21 disposed below and above the central wiring layer 10 and directly connected together are shaped like a trapezoid in cross section. The direction of taper of the interlayer connection 20 is identical to the direction of taper of the interlayer connection 21. Furthermore, in the multilayer wiring board 1, the interlayer connection 23 disposed in a front layer above the central wiring layer 10 and also above the interlayer connection 21 has a cross-sectionally trapezoidal shape. The direction of cross-sectionally trapezoidal shaped taper of the interlayer connection 23 is identical to the direction of cross-sectionally trapezoidal shaped taper of each of the interlayer connections 20 and 21. On the other hand, in the multilayer wiring board 1, the interlayer connection 22 disposed in a front layer below the central wiring layer 10 and also below the interlayer connection 20 has a cross-sectionally trapezoidal shape. However, the direction of cross-sectionally trapezoidal shaped taper of the interlayer connection 22 is opposite to the direction of cross-sectionally trapezoidal shaped taper of each of the interlayer connections 20, 21, 23.

As depicted in FIG. 1, according to the present embodiment, the multilayer wiring board 1 comprises at least one insulating layer 11, 13, 15, 17 and at least one wiring layer 12, 14, 16, 18 disposed above and below the central wiring layer 10 and the interlayer connections 20, 21, 22, 23 having the cross-sectionally trapezoidal shape and penetrating the insulating layers 11, 13, 15, 17 respectively to establish interlayer connection between the wiring layers 10, 12, 14, 16, 18. This means that the multilayer wiring board is a multilayer wiring board with at least three, odd number of wiring layers.

Furthermore, as depicted in FIG. 1, the interlayer connections 20, 21 having the cross-sectionally trapezoidal shape and disposed below and above the central wiring layer 10 and directly connected together have the taper in the identical direction. This can be achieved by using a core-less method to form the at least thee, odd number of wiring layers 12, 10, 14 in each of laminates 3b (see FIG. 7) disposed above and below a dummy core and forming the interlayer connections 20, 21 between all of the wiring layers 12, 10, 14. In other words, the core-less method stacks insulating layers and wiring layers only on one side of each of the laminates 3b, 3b disposed above and below the dummy core to form a multilayer structure. Thus, when the interlayer connection is formed for all of the stacked wiring layers 12, 10, 14, the interlayer connections 20, 21 all have a cross-sectionally trapezoidal shape with a taper in the same direction. Consequently, in the multilayer wiring board formed using the laminate 3b comprising the at least three, odd number of wiring layers 12, 10, 14 separated from the dummy core, the interlayer connections 20, 21 having the cross-sectionally trapezoidal shape and disposed below and above the central wiring layer 10 and directly connected together have the taper in the identical direction.

As described above, for the multilayer wiring board 1 in which the interlayer connections 20, 21 having the cross-sectionally trapezoidal shape and disposed below and above the central wiring layer 10 and directly connected together have the taper in the identical direction, the insulating layers 11, 13, the wiring layers 12, 10, 14, and the interlayer connections 20, 21 can be formed using the laminate 3b (see FIG. 7) formed using the core-less method. Thus, the insulating layers 11, 13, the wiring layers 12, 10, 14, and the interlayer connections 20, 21 can be formed using the core-less method, allowing thin boards to be easily handled. This enables a reduction in the thickness of the board. Furthermore, the laminates 3b, 3b can be simultaneously formed on the respective opposite sides of the dummy core, increasing production efficiency to enable a reduction in costs. Furthermore, since the interlayer connections 20, 21 are formed while being supported by the dummy core, dimensional changes are unlikely to occur, allowing the positional accuracy of the interlayer connections 20, 21 to be ensured. Thus, the multilayer wiring board 1 with high connection reliability can be provided. Moreover, since the multilayer wiring board 1 as a whole includes the odd number of wiring layers, the number of the wiring layers 14, 18 above the central wiring layer 10 is the same as the number of and the wiring layers 12, 14 below the central wiring layer 10. This allows warpage of the multilayer wiring board 1 to be suppressed.

As depicted in FIG. 1, the plurality of interlayer connections 20, 21, 22, 23 having the cross-sectionally trapezoidal shape and disposed above and below the central wiring layer 10 have the taper in the identical direction except the interlayer connection 22 provided in a front layer below the central wiring layer 10. In other words, of the plurality of interlayer connections 20, 21, 22, 23 having the cross-sectionally trapezoidal shape and disposed above and below the central wiring layer 10, only the interlayer connection 22 provided in the front layer below the central wiring layer 10 has a taper in the opposite direction. In this case, the multilayer wiring board 1 can be achieved by using the core-less method to produce the laminate 3b (see FIG. 7) with the odd number of wiring layers 12, 10, 14 and the interlayer connections 20, 21 for the wiring layers 12, 10, 14 formed therein, separating the laminate 3b from the dummy core, and forming one insulating layer 15, 17, one wiring layer 16, 18 and interlayer connections 22, 23 on each of the vertically opposite sides of the laminate 3b. As described above, compared to a case with only an insulating layer and a metal foil, the laminate 3b with the odd number of wiring layers 12, 10, 14 and the interlayer connections 20, 21 for the wiring layers 12, 10, 14 formed therein by means of the core-less method is increased in rigidity by plating for the interlayer connections 20, 21 and by the interlayer connections. The laminate 3b thus provides high operability and allows dimensional changes to be suppressed. Furthermore, after the laminate is separated from the dummy core, the two, upper and lower wiring layers 16, 18 can be formed simply by performing one lamination operation on the laminate 3b, thus improving production efficiency.

<Method for Manufacturing a Multilayer Wiring Board>

Now, an embodiment of a method for manufacturing the above-described multilayer wiring board 1 will be described below using FIGS. 2 to 9.

Figure 2:
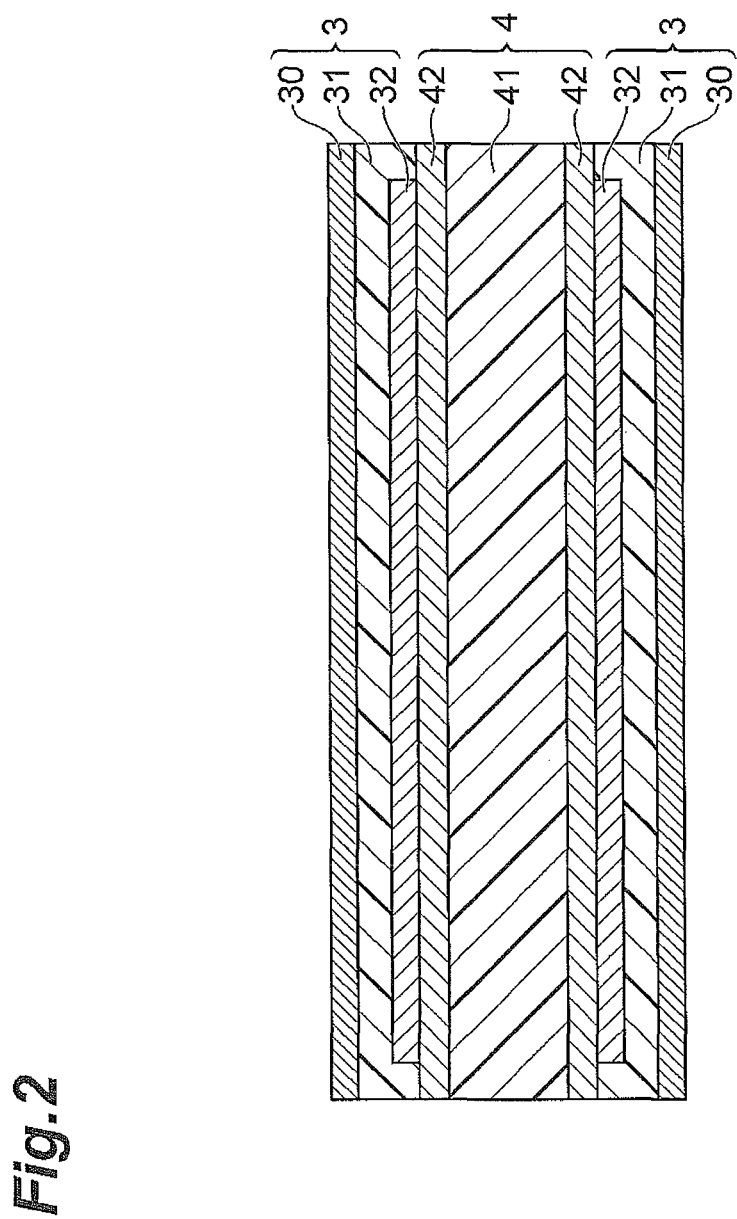
FIG. 2 is a cross-sectional flow diagram illustrating a step of a method for manufacturing the multilayer wiring board depicted in FIG. 1.

As depicted in FIG. 2, in the method for manufacturing the multilayer wiring board 1 according to the present embodiment, first, a support board 4 is produced or prepared in which a pair of metal foils 42 (support metal foils) is disposed on the respective vertically opposite surfaces of an insulating layer 41 (support insulating layer). Then, a metal foil 32 (first metal foil) with a surface area slightly smaller than the surface area of the metal foil 42, an insulating layer 31 (first insulating layer) with a surface area slightly larger than the surface area of the metal foil 32, and a metal foil 30 (second metal foil) are laid on top of the metal foil 42 of the support board 4 covered with the metal foil in this order, and the board is heated and pressured. The lamination of the metal foils 30, 32 and the insulating layer 31 is performed on both the upper and lower surfaces of the support board 4. Thus, a laminate 3 with the metal foils 30, 32 and the insulating layer 31 is formed on the support board 4 (step (a)). The metal foil 42 of the laminate plate which is the support board 4 and which is covered with the metal foil and the metal foil 32 slightly smaller than the laminate plate 4 covered with the metal foil are laid on top of each other in direct contact with each other. The periphery of the metal foil 42 is bonded with the insulating layer 31 slightly larger than the metal foil 32. Consequently, the metal foil 42 and the metal foil 32 are not bonded to each other, and can be easily peeled off from each other at any time by cutting and removing a peripheral bonding area of the metal foil 32 (an outer peripheral end of the insulating layer 31). In this regard, the support board 4 facilitates the handling of thin materials in a manufacturing process and is used only for the manufacturing process and does not provide the multilayer wiring board 1 itself, which is a product. In the present embodiment, the support board 4 may be referred to as a dummy core.

In the present embodiment, the metal foil 32 with a surface area slightly smaller than the surface area of the metal foil 42 is disposed on the metal foil 42 of the support board 4. In another embodiment, instead of the metal foil 42 and the metal foil 32, peelable copper foils may be used. The peelable copper foils refer to a plurality of copper foils including a carrier copper frame and a copper frame (generally a very thin copper frame of 1 to 9 μm) laminated together so as to be peelable from each other. In this case, the carrier copper frame of the peelable copper frames is disposed on a support board side so that the carrier copper frame corresponds to the metal foil 42, whereas the copper frame (generally a very thin copper frame of 1 to 9 μm) corresponds to the metal foil 32. In this case, since the carrier copper frame (corresponding to the metal foil 42) and the copper frame (metal foil 32) are laminated together so as to be peelable from each other, there is no possibility that displacement or lift occurs between the carrier copper frame (corresponding to the metal foil 42) and the copper frame (metal foil 32) during the manufacturing process. This improves the positional accuracy and prevents warpage. Furthermore, the carrier copper frame (corresponding to the metal foil 42) and the copper frame (metal foil 32) can be manually peeled off from each other, and thus the peeling operation is easy. In another embodiment, as the support board 4 according to the present embodiment, the support board 4 may be used which comprises an insulating layer and a peelable copper frame laminated to each of the metal foils 42 on the upper and lower surfaces of the support board 4. In this case, the rigidity of the support board 4 is further enhanced, allowing possible deformation during the manufacturing process to be suppressed. This further improves the positional accuracy and prevents warpage, and also facilitates handling.

Figure 3:
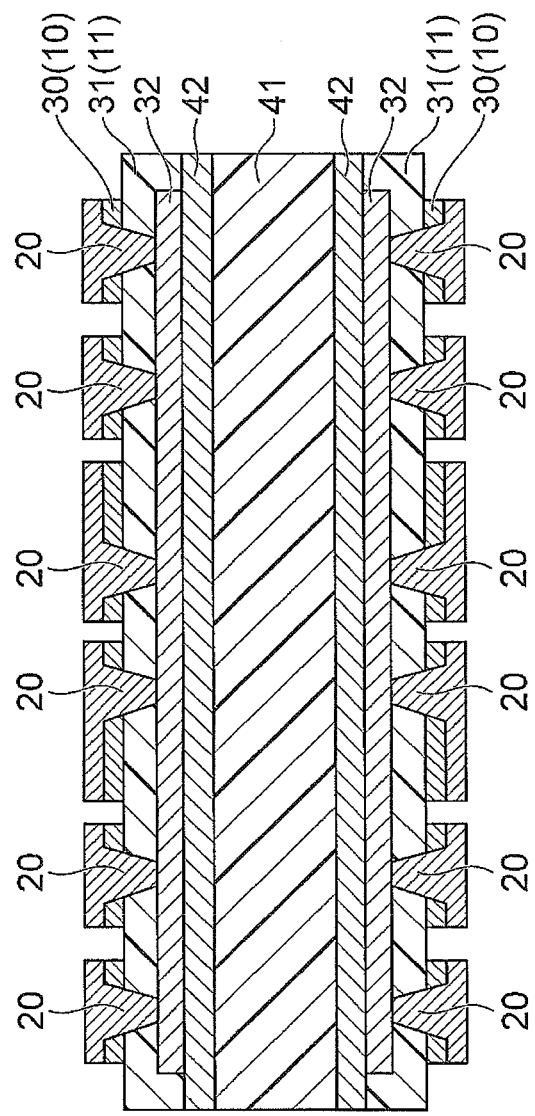
FIG. 3 is a cross-sectional flow diagram illustrating a step of the method for manufacturing the multilayer wiring board depicted in FIG. 1.

Subsequently, as depicted in FIG. 3, in the method for manufacturing the multilayer wiring board 1 according to the present embodiment, the interlayer connection 20 (first interlayer connection) is formed so as to penetrate the insulating layer 31 of the laminate 3 from the front layer toward the support board 4 to establish interlayer connection between the metal foil 30 and the metal foil 32 (step (b)). Formation of the interlayer connection 20 can be achieved by forming a hole for the interlayer connection in the insulating layer 31 by means of laser processing or the like so that the hole extends from the front layer toward the support board 4 along the laminating direction and then performing plating for interlayer connection on the hole. A conformal method, a direct laser method, or the like may be used to form the hole for the interlayer connection by means of laser processing. As the plating for interlayer connection, for example, electroless copper plating, electrolytic copper plating, or the like may be used. As the electrolytic copper plating, filled via plating that allows the hole for the interlayer connection to be filled with copper plating is preferable in terms of increased density. Since the interlayer connection 20 is formed by forming the hole that penetrates the layers from the front layer toward the support board 4, the cross-sectional shape of the interlayer connection 20 is a trapezoidal shape with a taper that makes the width of the shape decrease from the front layer toward the support board 4.

Furthermore, the metal foil 30 is processed to form the central wiring layer 10 with a circuit pattern (step (i)). In a method for forming the central wiring layer 10, for example, etching or the like may be used to form the circuit pattern. The central wiring layer 10 is also a metal foil and may be thus hereinafter also referred to as the metal foil 30.

Figure 4:
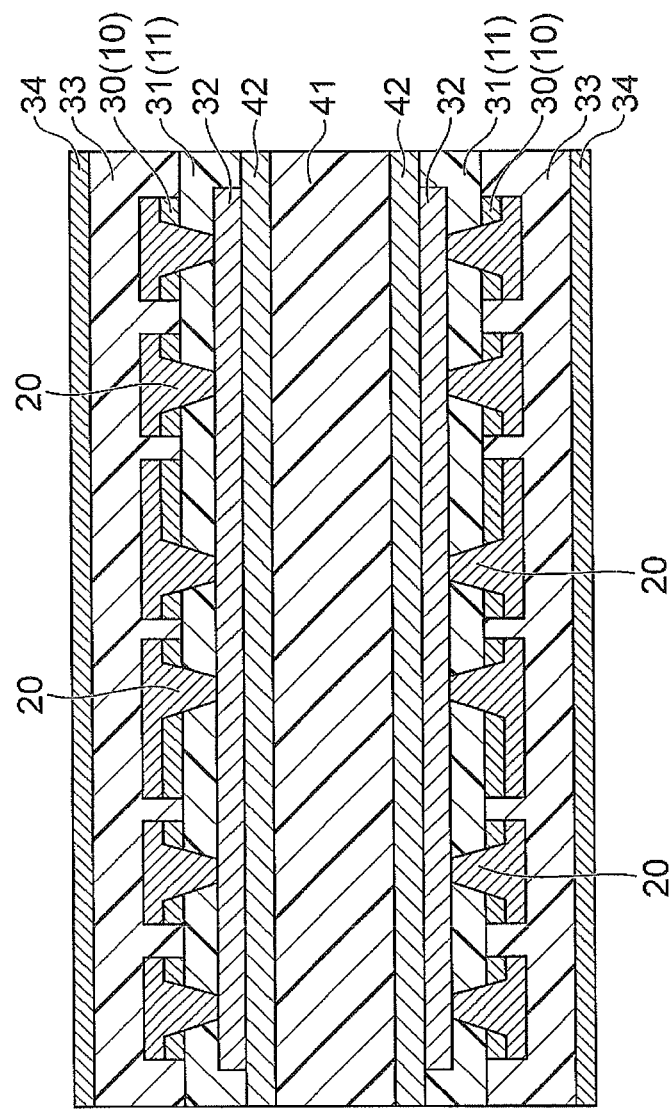
FIG. 4 is a cross-sectional flow diagram illustrating a step of the method for manufacturing the multilayer wiring board depicted in FIG. 1.

Subsequently, as depicted in FIG. 4, in the method for manufacturing the multilayer wiring board 1 according to the present embodiment, the insulating layer 33 (second insulating layer) and the metal foil 34 (third metal foil) are laid and laminated on top of the metal foil 30 (central wiring layer 10 formed by processing the metal foil 30 by means of etching or the like), and the board is heated and pressured (step (c)).

Figure 5:
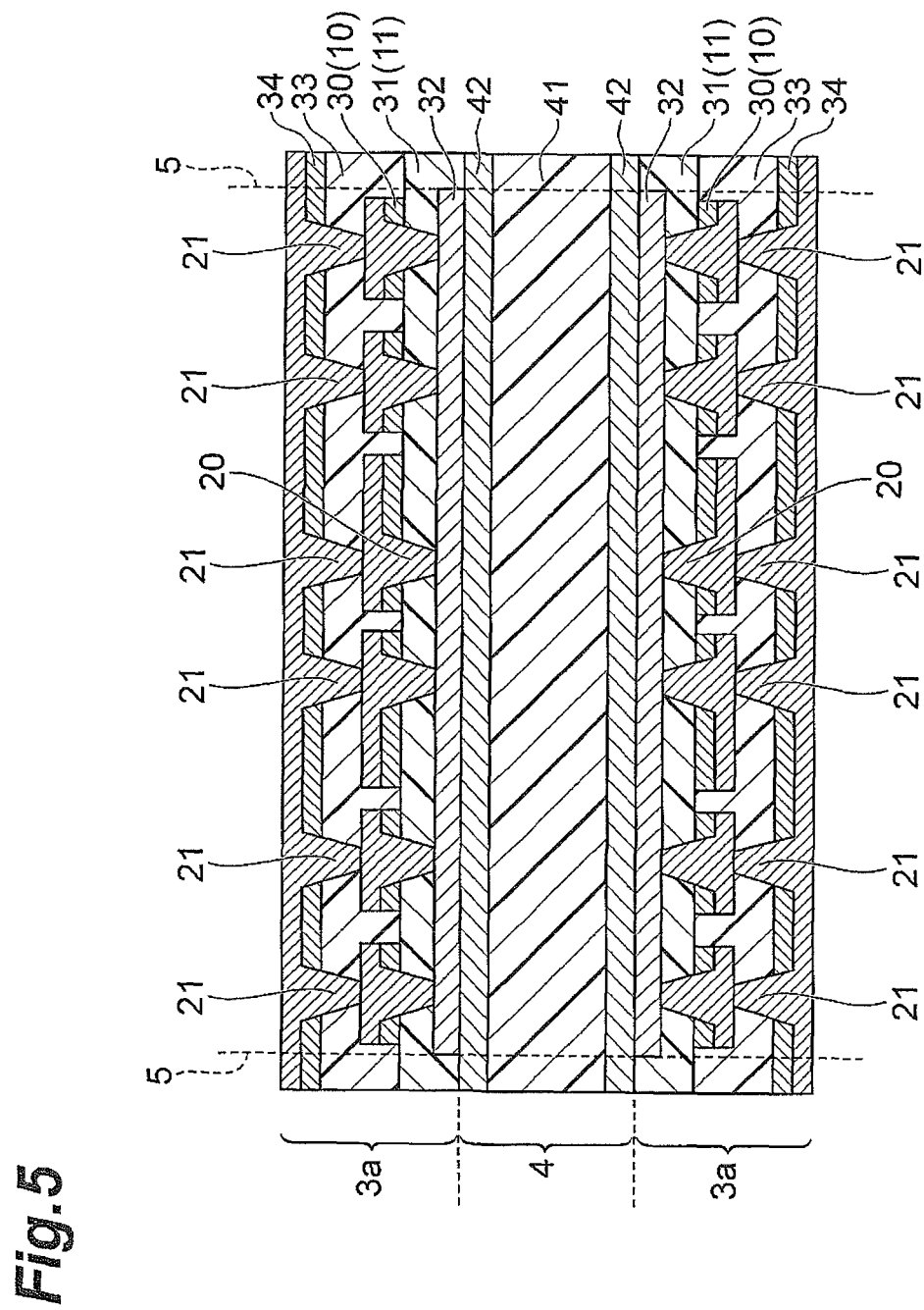
FIG. 5 is a cross-sectional flow diagram illustrating a step of the method for manufacturing the multilayer wiring board depicted in FIG. 1.

Subsequently, as depicted in FIG. 5, the interlayer connection 21 (second interlayer connection) is formed so as to penetrate the insulating layer 33 of the laminate 3a from the front layer toward the support board 4 to connect the metal foil 34 and the metal foil 30 (central wiring layer 10) (step (d)). As is the case with the interlayer connection 20, formation of the interlayer connection 21 can be achieved by forming a hole for the interlayer connection in the insulating layer 33 by means of laser processing or the like so that the hole extends from the front layer toward the support board 4 along the laminating direction and then performing plating for interlayer connection on the hole. Since the interlayer connection 21 is formed by forming the hole that penetrates the layers from the front layer toward the support board 4, the cross-sectional shape of the interlayer connection 21 is, like the cross-sectional shape of the interlayer connection 20, a trapezoidal shape with a taper that makes the width of the shape decrease from the front layer toward the support board 4. When the interlayer connection 21 is formed, the metal foil 34 may be processed similarly to the metal foil 30 to form the wiring layer 14 with a circuit pattern. However, the number of steps needed may be reduced by forming all of the wiring layers together in subsequent step (j).

Figure 6:
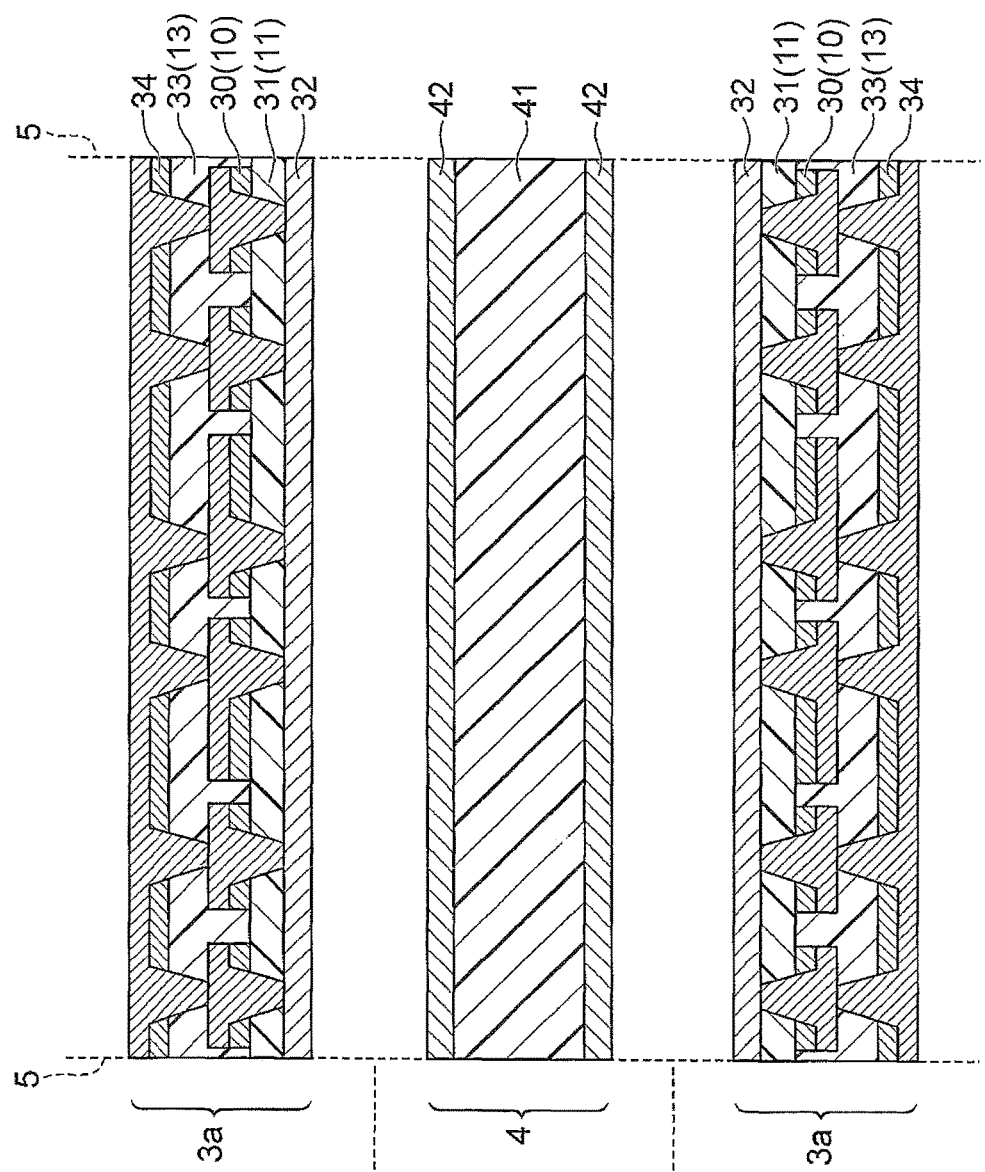
FIG. 6 is a cross-sectional flow diagram illustrating a step of the method for manufacturing the multilayer wiring board depicted in FIG. 1.

Subsequently, as depicted in FIG. 5 and FIG. 6, the laminate 3a is separated from the support board 4 between the metal foil 42 of the support board 4 and the metal foil 32 of the laminate 3a (step (e)). In this separation step, cutting is performed at cutting positions 5, 5 to remove the bonding area between the insulating layer 31 and the metal foil 42 around the periphery of the metal foil 32. This allows the laminate 3a to be easily separated from the support board 4 between the metal foil 42 and the metal foil 32. Since one laminate 3a is formed on each of the upper and lower surfaces of one support board 4, two laminates 3a can be obtained from one support board 4. The laminate 3a comprises the metal foils 32, 30, 34, the insulating layers 31, 33, and the interlayer connections 20, 21.

Figure 7:
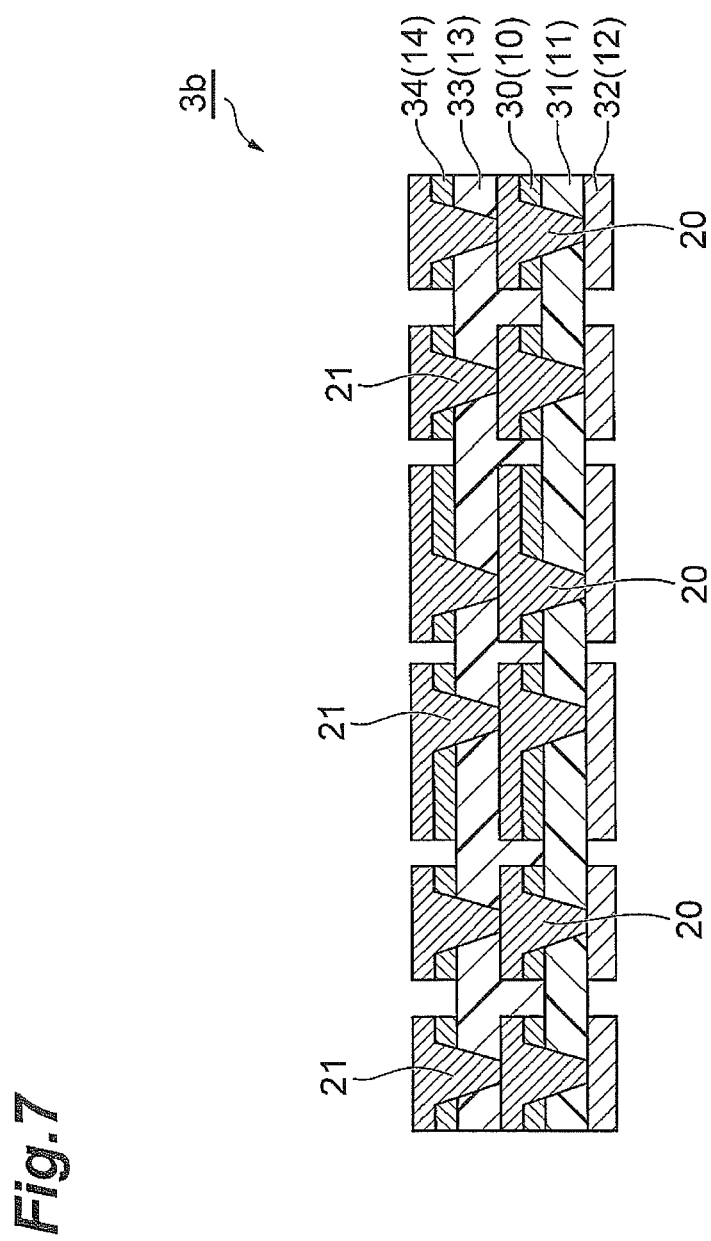
FIG. 7 is a cross-sectional flow diagram illustrating a step of the method for manufacturing the multilayer wiring board depicted in FIG. 1.

Subsequently, as depicted in FIG. 7, the metal foil 32 and metal foil 34 in the laminate 3a are processed by means of etching or the like to form the wiring layers 12 and 14 with circuit patterns on the respective opposite surfaces of the laminate 3a (step (j)). When the metal foil 32 and the metal foil 34 are processed at this stage, the circuit patterns can be formed on both surfaces of the laminate 3a during one step to form the laminate 3a into the laminate 3b. Since the wiring layers 12, 14 are also metal foils, the wiring layers 12, 14 may be hereinafter also referred to as the metal foils 32, 34. Furthermore, the laminate 3b depicted in FIG. 7 may be used as the multilayer wiring board as needed. Even in the multilayer wiring board comprising the laminate 3b, the interlayer connection 20 is disposed so as to connect to a portion below the central wiring layer 10, the interlayer connection 21 is disposed so as to connect to a portion above the central wiring layer 10, and the directions of the tapers of the cross-sectionally trapezoidal shapes of the interlayer connections 20, 21 both are identical.

Figure 8:
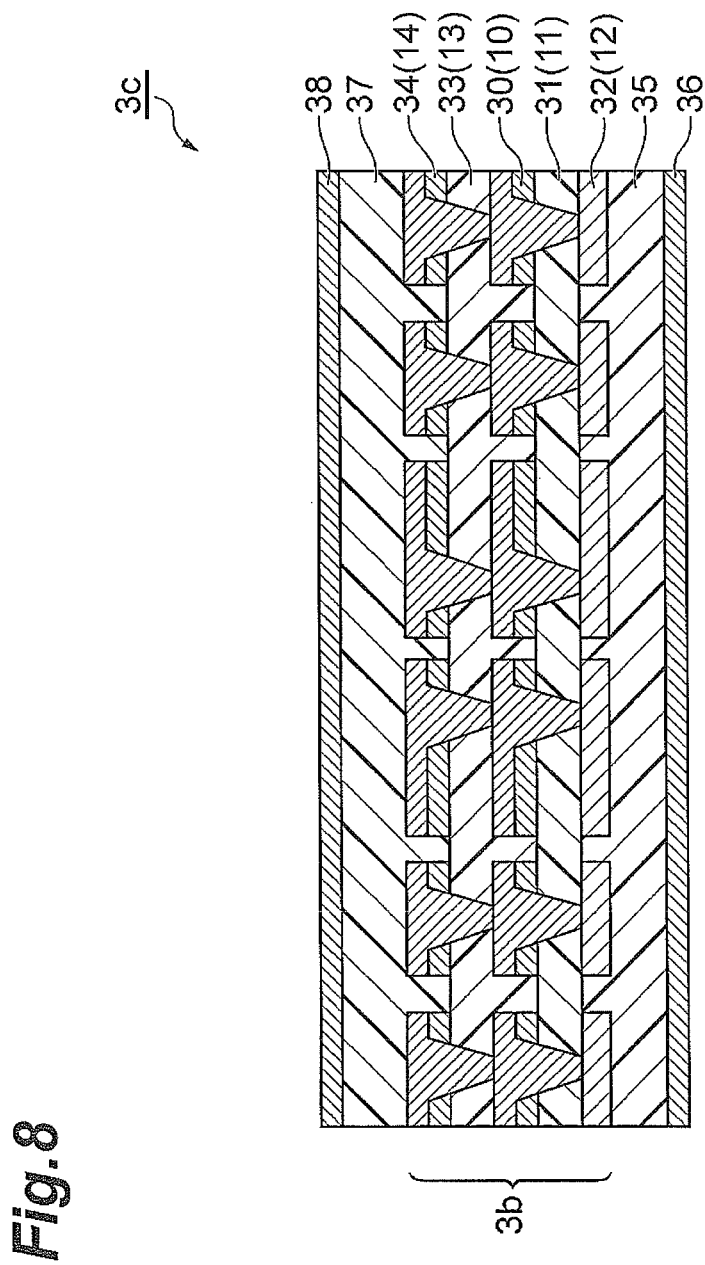
FIG. 8 is a cross-sectional flow diagram illustrating a step of the method for manufacturing the multilayer wiring board depicted in FIG. 1.

Subsequently, as depicted in FIG. 8, an insulating layer 37 (fourth insulating layer) and a metal foil 38 (fifth metal foil) are laminated in this order on the metal foil 34 (wiring layer 14) formed on the upper surface of the laminate 3b, and an insulating layer 35 (third insulating layer) and a metal foil 36 (fourth metal foil) are laminated in a downward direction in this order on the metal foil 32 (wiring layer 12) formed on the lower surface of the laminate 3b, and thereby the laminate 3c is formed. The whole of the laminated 3c is heated and pressured (step (f)).

Then, as depicted in FIG. 9, the interlayer connection 22 is formed so as to penetrate the insulating layer 35 upward from the lower front layer to connect the metal foil 36 (wiring layer 16) and the metal foil 32 (wiring layer 12) together (step (g)). As is the case with the interlayer connections 20, 21, formation of the interlayer connection 22 can be achieved by forming a hole for the interlayer connection in the insulating layer 35 by means of laser processing or the like so that the hole extends upward from the lower front layer and then performing plating for interlayer connection on the hole. For the interlayer connection 22, since the interlayer connection 22 is formed by forming the hole that penetrates the layers in an upward direction from the lower front layer unlike the penetrating direction in the interlayer connections 20, 21, the cross-sectional shape of the interlayer connection 22 is, unlike the cross-sectional shapes of the interlayer connections 20, 21, a trapezoidal shape with a taper that makes the width of the shape decrease in an upward direction from the lower front layer. In other words, the cross-sectionally trapezoidal shape of the interlayer connection 22 is a taper in a direction different from the direction in the cross-sectionally trapezoidal shapes of the interlayer connections 20, 21.

Furthermore, the interlayer connection 23 is formed so as to penetrate the insulating layer 37 downward from the upper front layer to connect the metal foil 38 (wiring layer 18) and the metal foil 34 (wiring layer 14) together (step h). As is the case with the interlayer connections 20, 21, formation of the interlayer connection 23 can be achieved by forming a hole for the interlayer connection in the insulating layer 37 by means of laser processing or the like so that the hole extends downward from the upper front layer and then performing plating for interlayer connection on the hole. The interlayer connection 23 involves a penetrating direction which is different from the penetrating direction in the interlayer connection 22 but which is identical to the penetrating direction in the interlayer connections 20, 21, and is formed by forming the hole that penetrates the layers downward from the upper front layer. Thus, the cross-sectional shape of the interlayer connection 23 is, like the cross-sectional shapes of the interlayer connections 20, 21, a trapezoidal shape with a taper that makes the width of the shape decrease in a downward direction from the upper front layer. In other words, the cross-sectionally trapezoidal shape of the interlayer connection 23 is a taper in a direction different from the direction of the cross-sectionally trapezoidal shape of the interlayer connection 22. A step of forming the interlayer connections 22 and 23 allows the insulating layers 35, 37, the metal foils 36, 38 (wiring layers 16, 18), and the interlayer connections 22, 23 to be formed below and above the laminate 3b, respectively, during the single step, and has high production efficiency.

After the step of forming the interlayer connection 21 (step (d)) and before the step of separating the laminate 3a from the support board 4 (step (e)), the laminate 3a with an even number of insulating layers may be formed by repeating, a desired number of times a step of further laying an insulating layer and a metal foil on top of the metal foil 34 (see FIG. 5), heating and pressuring the board, and forming an interlayer connection that penetrates the insulating layers toward the support board 4 to establish interlayer connection between the metal foil on a support board 4 side and the metal foil on a side away from the support board 4 across the insulating layer (step (k)). Thus, the multilayer wiring board 1 with a desired odd number of wiring layer can be easily produced.

EXAMPLE

The present invention will be more specifically described below by referring to an example. However, the present invention is not limited to the following example.

First, as depicted in FIG. 2, a copper laminate plate (metal foil laminate plate 4; manufactured by Hitachi Chemical Co., Ltd.; MCL-E-67; "MCL" is a registered trademark) was prepared in which a copper foil (metal foil 42) of thickness 12 μm was laminated to a glass epoxy material (insulating layer 41). On each of the opposite sides of the copper laminate plate 4, a copper foil of thickness 12 μm (manufactured by MITSUI MINING & SMELTING CO., LTD.; 3EC-VLP-12) was placed such that a glossy surface of the copper foil lied opposite the copper foil (support metal foil 42) of the copper laminate plate, as the metal foil 32 with a surface area slightly smaller than the surface area of the copper foil (metal foil 42) of the copper laminate plate. Subsequently, on the outer side of the metal foil 32, a prepreg (manufactured by Hitachi Chemical Co., Ltd.; GEA-679FG) was laminated as the insulating layer 31. Moreover, outside the insulating layer 31, a very thin copper frame with a carrier (manufactured by MITSUI MINING & SMELTING CO., LTD.; MT18SDH5) in which a carrier copper foil of thickness 18 μm was laminated to a very thin copper frame of thickness 5 μm was placed as the metal foil 30 so that a roughened surface of the 5-μm very thin copper frame was bonded to the insulating layer 31. Then, the layers were laminated in a vacuum hot press, and the 18-μm carrier copper foil was peeled off to form the laminate plate 3.

Then, as depicted in FIG. 3, a conformal mask with an opening of diameter 100 μm was formed on each of the copper foils (metal foils 30) on the opposite outer sides of the laminate plate 4 by means of the etching method. The opening in the conformal mask was formed at a position where the interlayer connection 20 for the metal foil 32 and the metal foil 30 was provided. A hole for the interlayer connection was formed by means of laser processing, and a catalyzed nucleus was applied onto the copper foil (metal foil 30) and into the hole for the interlayer connection using HS201B (manufactured by Hitachi Chemical Co., Ltd.; a trade name) that was a colloidal palladium catalyst. Subsequently, a base electroless plating layer of thickness 1 μm was formed using CUST 2000 (manufactured by Hitachi Chemical Co., Ltd.; a trade name). Subsequently, the hole for the interlayer connection was filled by means of filled via plating using an electrolytic filled via plating solution, to form the interlayer connection 20. When the interlayer connection 20 was formed by means of filled via plating, the thickness of a plating layer produced on the metal foil 30 was 20 μm. Then, a predetermined circuit pattern was formed on the metal foil 30 by means of the etching method, and the front surface of the resultant wiring layer 10 was roughened using a roughening treatment liquid MULTI-BOND MB-100 (manufactured by Nippon MacDermid Co., Ltd.; a trade name).

Then, as depicted in FIG. 4, a prepreg (manufactured by Hitachi Chemical Co., Ltd.; GEA-679FG) was used as the insulating layer 33, and as the metal foil 34 outside it, a very thin copper foil with a carrier (manufactured by MITSUI MINING & SMELTING CO., LTD.; MT18SDH5) was used in which a carrier copper foil of thickness 18 μm was laminated to a very thin copper frame of thickness 5 μm. The prepreg and the very thin copper foil were configured so that the roughened surface of the 5-μm very thin copper foil came into contact with the insulating layer 33. The layers were laminated in the vacuum hot press, and the 18-μm carrier copper foil was peeled off to form the laminate plate 3.

Then, as depicted in FIG. 5, a hole for the interlayer connection was formed in the laminate plate 3, and the interlayer connection 21 establishing interlayer connection between the metal foil 30 and the metal foil 34 was formed by means of filled plating.

Then, as depicted in FIG. 6, cutting was performed at the cutting positions 5, 5 set slightly inward of the end of the slightly smaller metal foil 32 to separate the support board 4 from each of the upper and lower laminates 3a. Thus, two laminates 3a each with the three metal foils 32, 30, 34 (wiring layers 12, 10, 14) were obtained.

Then, as depicted in FIG. 7, the metal foil 32 and metal foil 34, which were the outermost layers of the separated laminate 3a, were processed by means of the etching method to form circuit patterns on the wiring layer 12 and the wiring layer 14.

Then, as depicted in FIG. 8, below and above the separated laminate 3b, prepregs (manufactured by Hitachi Chemical Co., Ltd.; GEA-679FG) were used as the insulating layers 35, 37, and as the metal foils 36, 38 outside them, very thin copper foils with carriers (manufactured by MITSUI MINING & SMELTING CO., LTD.; MT18SDH5) were used in which a carrier copper foil of thickness 18 µm was laminated to a very thin copper frame of thickness 5 µm. The prepregs and the very thin copper foils were configured so that the roughened surface of the 5-µm very thin copper foil came into contact with the insulating layers 35, 37. The layers were laminated in the vacuum hot press, and the 18-µm carrier copper foil was peeled off to form the laminate plate 3c.

Then, as depicted in FIG. 9, the interlayer connections 22, 23 penetrating the insulating layers 35, 37 were formed like the interlayer connections 20, 21. The metal foils 36, 38, which were lower and upper outermost layers of the laminate plate 1, were processed by means of the etching method to form circuit patterns on the wiring layers 16, 18. Thus, a multilayer wiring board was able to be produced for which warpage was inhibited and which had a reduced thickness. In this multilayer wiring board, at least the interlayer connections 20, 21 were able to be produced by means of the core-less method, allowing connection reliability to be enhanced at low costs.

INDUSTRIAL APPLICABILITY

The present invention is applicable to a multilayer wiring board with an odd number of wiring layers laminated thereon and a method for manufacturing the multilayer wiring board.

REFERENCE SIGNS LIST

1 Multilayer wiring board
3, 3a, 3b, 3c Laminate
4 Support board
10 Central wiring layer
11 Insulating layer (first insulating layer)
12 Wiring layer (first wiring layer)
13 Insulating layer (second insulating layer)
14 Wiring layer (second wiring layer)
15 Insulating layer (third insulating layer)
16 Wiring layer (third wiring layer)
17 Insulating layer (fourth insulating layer)
18 Wiring layer (fourth wiring layer)
20 Interlayer connection (first interlayer connection)
21 Interlayer connection (second interlayer connection)
22 Interlayer connection (third interlayer connection)
23 Interlayer connection (fourth interlayer connection)
30 Metal foil (second metal foil)
31 Insulating layer (first insulating layer)
32 Metal foil (first metal foil)
33 Insulating layer (second insulating layer)
34 Metal foil (third metal foil)
35 Insulating layer (third insulating layer)
36 Metal foil (fourth metal foil)
37 Insulating layer (fourth insulating layer)
38 Metal foil (fifth metal foil)
41 Insulating layer (support insulating layer)
42 Metal foil (support metal foil)

The invention claimed is:
1. A multilayer wiring board comprising:
an odd number of wiring layers comprising:
a first wiring layer consisting essentially of a metal foil;
a first insulating layer disposed on the first wiring layer;
a central wiring layer disposed on the first insulating layer opposite the first wiring layer, the central wiring layer comprising:
a first side;
a second side opposite the first side;
a metal foil layer; and
a plating layer comprising a first interlayer connection, the first interlayer connection having a cross-sectionally trapezoidal shape comprising a taper penetrating the first insulating layer to establish interlayer connection between the central wiring layer and the first wiring layer,
wherein the metal foil layer of the central wiring layer is thinner than the first wiring layer;
a second insulating layer disposed on the central wiring layer opposite the first insulating layer;
a second wiring layer disposed on the second insulating layer opposite the central wiring layer, the second wiring layer comprising:
a metal foil layer; and
a plating layer comprising a second interlayer connection, the second interlayer connection having a cross-sectionally trapezoidal shape comprising a taper penetrating the second insulating layer to establish interlayer connection between the central wiring layer and the second wiring layer,
wherein the first interlayer connection is disposed so as to connect to the first side of the central wiring layer and the second interlayer connection is disposed so as to connect to the second side of the central wiring layer, and direction of the tapers of the cross-sectionally trapezoidal shapes of the first and second interlayer connections are identical,
a third insulating layer disposed on the first wiring layer of the odd number of wiring layers opposite the first insulating layer of the odd number of wiring layers; and
a third wiring layer disposed on the third insulating layer opposite the first wiring layer of the odd number of wiring layers,
a third interlayer connection having a cross-sectionally trapezoidal shape comprising a taper penetrating the third insulating layer to establish interlayer connection between the first wiring layer of the odd number of wiring layers and the third wiring layer, wherein the third interlayer connection penetrates the third wiring layer,
wherein the direction of the taper of the cross-sectionally trapezoidal shapes of each of the first and second interlayer connections and a direction of the taper of the cross-sectionally trapezoidal shape of the third interlayer connection are opposite each other,
a fourth insulating layer disposed on the second wiring layer of the odd number of wiring layers opposite the second insulating layer; and
a fourth wiring layer disposed on the fourth insulating layer opposite the second wiring layer of the odd number of wiring layers, and
a fourth interlayer connection having a cross-sectionally trapezoidal shape comprising a taper penetrating the fourth insulating layer to establish interlayer connection between the second wiring layer of the odd number of wiring layers and the fourth wiring layer,
wherein the direction of the taper of the cross-sectionally trapezoidal shapes of each of the first and second interlayer connects and a direction of the taper of the cross-sectionally trapezoidal shape of the fourth interlayer connection are identical, and wherein each outermost layer of the multilayer wiring board is a wiring layer including a circuit pattern.

2. The multilayer wiring board according to claim 1, wherein the outermost layers are the third wiring layer and the fourth wiring layer.

3. The multilayer wiring board according to claim 1, wherein the thickness of the first wiring layer is 1 µm to 9 µm.

4. The multilayer wiring board according to claim 1, wherein the metal foil layer of the second wiring layer is thinner than the first wiring layer.

5. The multilayer wiring board according to claim 1, wherein the first insulating layer includes a prepreg.

6. The multilayer wiring board according to claim 1, wherein the second insulating layer includes a prepreg.

7. The multilayer wiring board according to claim 1, wherein a metal foil layer of the third wiring layer is thinner than the first wiring layer.

8. The multilayer wiring board according to claim 1, wherein a metal foil layer of the fourth wiring layer is thinner than the first wiring layer.

9. The multilayer wiring board according to claim 1, wherein a thickness of the first wiring layer is more than double a thickness of the metal foil layer of the central wiring layer.

10. The multilayer wiring board according to claim 1, wherein the metal foil layer of the second wiring layer is thinner than the first wiring layer, a metal foil layer of the third wiring layer is thinner than the first wiring layer, and a metal foil layer of the fourth wiring layer is thinner than the first wiring layer.

* * * * *